(12) United States Patent
Koh et al.

(10) Patent No.: US 8,877,877 B2
(45) Date of Patent: Nov. 4, 2014

(54) POLYORGANOSILOXANE, ENCAPSULATION MATERIAL OBTAINED FROM THE POLYORGANOSILOXANE, AND ELECTRONIC DEVICE INCLUDING THE ENCAPSULATION MATERIAL

(75) Inventors: Sang-Ran Koh, Uiwang-si (KR); June-Ho Shin, Uiwang-si (KR); Woo-Han Kim, Uiwang-si (KR); Sung-Hwan Cha, Uiwang-si (KR); Hyun-Jung Ahn, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 25 days.

(21) Appl. No.: 13/207,665

(22) Filed: Aug. 11, 2011

(65) Prior Publication Data

US 2012/0046423 A1  Feb. 23, 2012

(30) Foreign Application Priority Data

Aug. 18, 2010  (KR) .................. 10-2010-0079779

(51) Int. Cl.
| | |
|---|---|
| *C08G 77/38* | (2006.01) |
| *C08L 83/04* | (2006.01) |
| *C08L 83/07* | (2006.01) |
| *C08L 83/05* | (2006.01) |
| *H01L 23/29* | (2006.01) |
| *C08G 77/20* | (2006.01) |
| *C08G 77/00* | (2006.01) |
| *C08G 77/12* | (2006.01) |

(52) U.S. Cl.
CPC ............... *H01L 23/296* (2013.01); *C08L 83/04* (2013.01); *C08G 77/20* (2013.01); *C08G 77/70* (2013.01); *C08G 77/12* (2013.01); *H01L 2924/12044* (2013.01); *C08G 77/80* (2013.01)
USPC .............. 525/478; 525/100; 525/477; 528/32

(58) Field of Classification Search
USPC ................... 525/100, 478, 477; 528/32
See application file for complete search history.

(56) References Cited

U.S. PATENT DOCUMENTS 5,578,380 A * 11/1996 Babu ........................... 428/447
7,527,871 B2  5/2009 Morita et al.
7,781,522 B2  8/2010 Morita et al.
8,119,249 B2  2/2012 Murai et al.
2005/0171233 A1  8/2005 Bublewitz et al.
2006/0081864 A1 * 4/2006 Nakazawa ....................... 257/98
2008/0227930 A1  9/2008 Lautenschlager et al.
2009/0105395 A1  4/2009 Kamata et al.
2009/0189180 A1 * 7/2009 Murai et al. .................. 257/100

FOREIGN PATENT DOCUMENTS

| CN | 1749323 A | 3/2006 |
|---|---|---|
| CN | 101198654 A | 6/2008 |
| JP | 07-149907 A | 6/1995 |
| KR | 10-2007-0007255 A | 1/2007 |
| KR | 10-0722464 B1 | 5/2007 |
| KR | 10-2008-0110761 A | 12/2008 |
| KR | 10-2010-0030959 A | 3/2010 |
| TW | 200940653 A1 | 10/2009 |
| WO | WO 2008/007839 A1 | 1/2008 |

OTHER PUBLICATIONS

Chinese Search Report in CN 2011102338822, dated Dec. 29, 2012 (Koh, et al.).
Taiwanese Search Report in related application TW 100116331, dated Nov. 26, 2013 (Koh, et al.).

* cited by examiner

*Primary Examiner* — Randy Gulakowski
*Assistant Examiner* — Christopher M Rodd
(74) *Attorney, Agent, or Firm* — Lee & Morse, P.C.

(57) ABSTRACT

A polyorganosiloxane composition, an encapsulation material, and an electronic device, the polyorganosiloxane composition including a linear first polyorganosiloxane resin including a moiety represented by the following Chemical Formula 1 and a moiety represented by the following Chemical Formula 2, the first polyorganosiloxane resin including double bonds at both terminal ends thereof, and a second polyorganosiloxane resin having a three dimensional network structure,

[Chemical Formula 1]

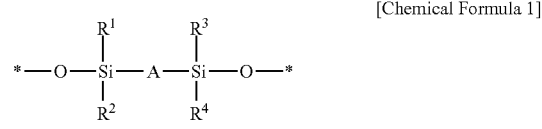

[Chemical Formula 2]

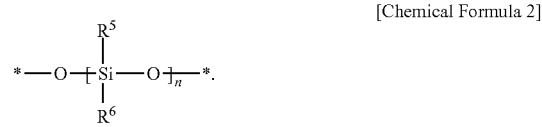

11 Claims, No Drawings

POLYORGANOSILOXANE, ENCAPSULATION MATERIAL OBTAINED FROM THE POLYORGANOSILOXANE, AND ELECTRONIC DEVICE INCLUDING THE ENCAPSULATION MATERIAL

BACKGROUND OF THE INVENTION

1. Field

Embodiments relate to a polyorganosiloxane composition, an encapsulation material obtained from the polyorganosiloxane composition, and an electronic device including the encapsulation material.

2. Description of the Related Art

A light emitting element, e.g., a light emitting diode (LED), an organic light emitting diode (OLED), a photoluminescent (PL) device, and the like, has been variously applied to, e.g., a domestic electric device, a lighting device, a display device, various automatic devices, and the like. The light emitting element may display intrinsic colors such as blue, red, and green using a light emitter, or white light by combining light emitters displaying different colors.

Such a light emitting element may generally have a packaging or encapsulation structure. The packaging or encapsulation structure may be made of an encapsulation material including a transparent resin being capable of externally transmitting light emitted from a light emitting element. The encapsulation material may be located where light passes. Accordingly, the encapsulation material should have heat and light resistance.

SUMMARY

Embodiments are directed to a polyorganosiloxane composition, an encapsulation material obtained from the polyorganosiloxane composition, and an electronic device including the encapsulation material.

The embodiments may be realized by providing a polyorganosiloxane composition including a linear first polyorganosiloxane resin including a moiety represented by the following Chemical Formula 1 and a moiety represented by the following Chemical Formula 2, the first polyorganosiloxane resin including double bonds at both terminal ends thereof, and a second polyorganosiloxane resin having a three dimensional network structure,

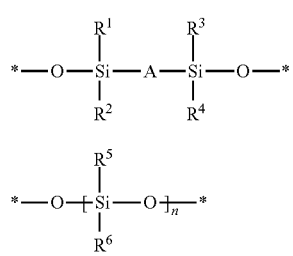

[Chemical Formula 1]

[Chemical Formula 2]

wherein, in Chemical Formulae 1 and 2, A is an organic group including at least two alicyclic rings, an organic group including at least one aromatic ring, or a combination thereof, $R^1$ to $R^6$ are each independently a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, and n is 1 to about 50.

The second polyorganosiloxane resin may be represented by the following Chemical Formula 3:

$$[R^7SiO_{3/2}]_T[R^8R^9SiO]_D[R^{10}R^{11}R^{12}SiO_{1/2}]_M \quad \text{[Chemical Formula 3]}$$

wherein, in Chemical Formula 3, $R^7$ to $R^{12}$ are each independently a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, provided that at least one of $R^{10}$, $R^{11}$ and $R^{12}$ is the C2 to C20 alkenyl group, T>0, D≥0, M>0, and T+D+M=1.

About 10% or more of $R^7$ to $R^{12}$ in Chemical Formula 3 may include an aryl group. The figure 10% indicates the ratio of the number of $R^7$ to $R^{12}$ being an aryl group to a total number of $R^7$ to $R^{12}$ included in Chemical Formula 3.

The second polyorganosiloxane resin may be obtained from the condensation/polymerization reaction of Chemical Formula 3a' and 3b' and/or Chemical Formula 3c'.

$$R^7SiX^1X^2X^3 \quad \text{[Chemical Formula 3a']}$$

$$R^8R^9SiX^4X^5 \quad \text{[Chemical Formula 3b']}$$

$$R^{10}R^{11}R^{12}SiX^6 \quad \text{[Chemical Formula 3c']}$$

wherein $R^7$ to $R^{12}$ are the same as defined in the above Chemical Formula 3 and $X^1$ to $X^6$ are each independently a $C_1$ to $C_6$ alkoxy group, hydroxy group, halogen, carboxyl group or a combination thereof.

The moiety represented by A in Chemical Formula 1 may include a moiety represented by at least one of the following Chemical Formulae 1a to 1e:

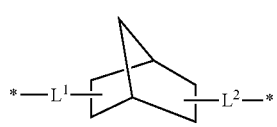

[Chemical Formula 1a]

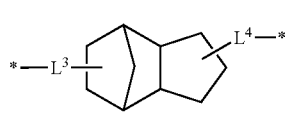

[Chemical Formula 1b]

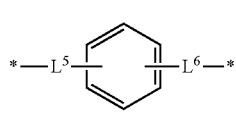

[Chemical Formula 1c]

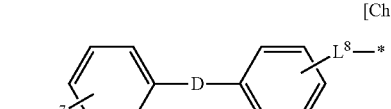

[Chemical Formula 1d]

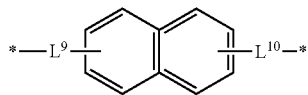

[Chemical Formula 1e]

wherein, in Chemical Formulae 1a to 1e, $L^1$ to $L^{10}$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C7 to C30 arylalkylene group, a substituted or unsubstituted C1 to C30 heteroalkylene group, a substituted or unsubstituted C2 to C30 heterocycloalkylene group, a substituted or unsubstituted C2 to C30 alkenylene group, or a combination thereof, D is a single bond, oxygen, a sulfonyl group, a methylene group, an ethylene group, a propylene group, a hexafluoropropylene group, or a combination thereof.

About 30% or more of $R^5$ and $R^6$ in Chemical Formula 2 may include an aryl group. The figure 30% indicates the ratio of the number of $R^5$ and $R^6$ being an aryl group to a total number of $R^5$ and $R^6$ included in Chemical Formula 2.

The first polyorganosiloxane resin may have a number average molecular weight of about 900 to about 20,000.

The first polyorganosiloxane resin may be included in an amount of about 10 to about 25 parts by weight, based on the total amount of the polyorganosiloxane composition, and the second polyorganosiloxane resin may be included in an amount of about 40 to about 75 parts by weight, based on the total amount of the polyorganosiloxane composition. Particularly, the amount ratio of the first and the second polyorganosiloxane resin is based on 100 parts by weight of the polyorganosiloxane composition.

The polyorganosiloxane composition may further include a curing agent, the curing agent including at least two silicon-hydrogen bonds.

The silicon-hydrogen bonds may be included in an amount of about 0.5 to 2.0 moles per 1 mole of a double bond of the first polyorganosiloxane resin and the second polyorganosiloxane resin.

The polyorganosiloxane composition may further include a hydrosilation catalyst.

The embodiments may also be realized by providing an encapsulation material prepared by curing the polyorganosiloxane composition of an embodiment.

The embodiments may also be realized by providing an electronic device including the encapsulation material of an embodiment.

The electronic device may include a light emitting diode, an organic light emitting diode, a photoluminescent device, or a solar cell encapsulated by the encapsulation material

DETAILED DESCRIPTION

Korean Patent Application No. 10-2010-0079779, filed on Aug. 18, 2010, in the Korean Intellectual Property Office, and entitled: "Polyorganosiloxane and Encapsulation Material Obtained from the Polyorganosiloxane and Electronic Device Including the Encapsulation Material," is incorporated by reference herein in its entirety.

Example embodiments will now be described more fully hereinafter; however, they may be embodied in different forms and should not be construed as limited to the embodiments set forth herein. Rather, these embodiments are provided so that this disclosure will be thorough and complete, and will fully convey the scope of the invention to those skilled in the art.

As used herein, when a definition is not otherwise provided, the term "substituted" may refer to one substituted with at least a substituent selected from the group of a halogen (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C30 alkyl group, a C2 to C16 alkenyl group, a C2 to C16 alkynyl group, a C6 to C30 aryl group, a C7 to C13 arylalkyl group, a C1 to C4 oxyalkyl group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C2 to C20 heterocycloalkyl group, and a combination thereof, instead of hydrogen of a compound.

As used herein, when a definition is not otherwise provided, the term "hetero" may refer to one including 1 to 3 heteroatoms selected from N, O, S, and P.

Hereinafter, a polyorganosiloxane composition according to an embodiment is described.

The polyorganosiloxane composition according to an embodiment may include a first polyorganosiloxane resin (having a linear structure) and a second polyorganosiloxane resin (having a three dimensional network structure).

The first polyorganosiloxane may include a moiety represented by the following Chemical Formula 1 and a moiety represented by the following Chemical Formula 2.

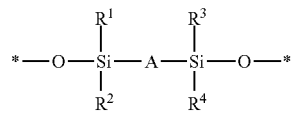

[Chemical Formula 1]

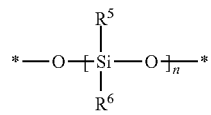

[Chemical Formula 2]

In Chemical Formulae 1 and 2, A may be an organic group including at least two alicyclic rings, an organic group including at least one aromatic ring, or a combination thereof, $R^1$ to $R^6$ may each independently be a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, and n may be 1 to about 50. * may represent a bond to O, Si, and/or C. Further, an O in Chemical Formula 1 may be the same as an O in Chemical Formula 2, i.e., Chemical Formulae 1 and 2 may be connected by an O—Si—O linkage.

The moiety represented by Chemical Formula 1 may structurally include a cyclic bridge hydrocarbon (A) linking between two silicon atoms. Such a structure may improve rigidity of the polyorganosiloxane. Accordingly, the siloxane resin may maintain a low coefficient of thermal expansion (CTE) and a low modulus. Thus, crack resistance and interface adherences may be increased.

In the moiety represented by Chemical Formula 1, the moiety represented by 'A' may include, e.g., at least one moiety represented by the following Chemical Formulae 1a to 1e.

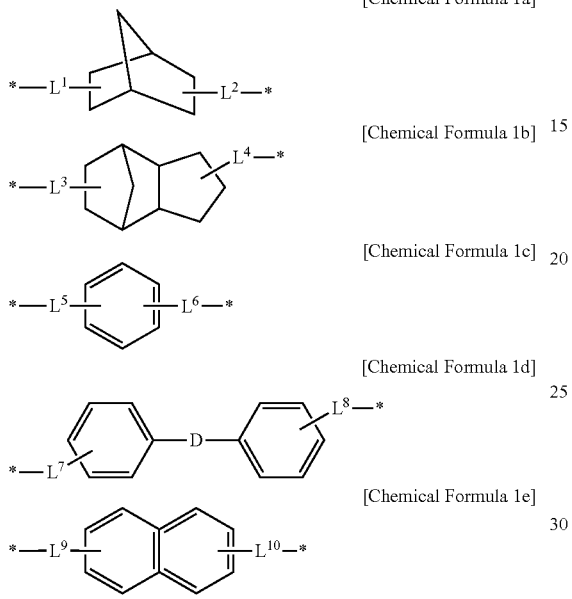

[Chemical Formula 1a]

[Chemical Formula 1b]

[Chemical Formula 1c]

[Chemical Formula 1d]

[Chemical Formula 1e]

In Chemical Formulae 1a to 1e, $L^1$ to $L^{10}$ may each independently be a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C7 to C30 an arylalkylene group, a substituted or unsubstituted C1 to C30 heteroalkylene group, a substituted or unsubstituted C2 to C30 heterocycloalkylene group, a substituted or unsubstituted C2 to C30 alkenylene group, or a combination thereof, and D is a single bond, oxygen, an oxygen-containing group, a sulfonyl group, a methylene group, an ethylene group, a propylene group, a hexafluoropropylene group, or a combination thereof.

The moiety represented by Chemical Formula 1 is not limited to those including moieties represented by Chemical Formulae 1a to 1e, and may be any one including an organic group including at least two alicyclic rings and/or an organic group including at least one aromatic ring.

The moiety represented by the above Chemical Formula 2 may be a siloxane group moiety having a silicon-oxygen-silicon bond.

The moiety represented by the above Chemical Formula 2 may include a substituent combined or bonded with silicon. For example, $R^5$ and $R^6$ may include at least 30% of an aryl group. When the moiety includes an aryl group within the range, a high refractive index may be achieved.

In the above Chemical Formula 2, n does not indicate a polymerization degree, but rather a total number (e.g., 1 to about 50) of the moiety [$R^5R^6SiO$—] included in the first polyorganosiloxane resin, particularly in Chemical Formula 2, when the moieties represented by Chemical Formulae 1 and 2 are included in a number greater than one. In the above Chemical Formula 2, n does not indicate a polymerization degree but rather the number of the $R^5R^6SiO$— ranging from 1 to 50, when more than one of the moieties represented by the following Chemical Formulae 1 and 2 of the first polyorganosiloxane resin are included.

The moiety represented by Chemical Formula 2 may be represented by the following Chemical Formula 2a.

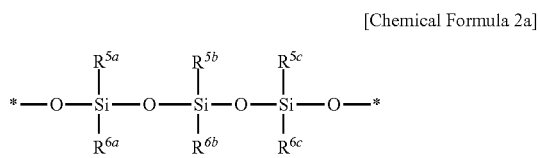

[Chemical Formula 2a]

In Chemical Formula 2a, $R^5a$, $R^5b$, $R^5c$, $R^6a$, $R^6b$ and $R^6c$ may each independently be a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof. At least 30% of $R^{5a}$, $R^{5b}$, $R^{5c}$, $R^{6a}$, $R^{6b}$ and $R^{6c}$ may be an aryl group. The figure 30% indicates the ratio of the number of $R^{5a}$, $R^{5b}$, $R^{5c}$, $R^{6a}$, $R^{6b}$ and $R^{6c}$ being an aryl group to a total number of $R^{5a}$, $R^{5b}$, $R^{5c}$, $R^{6a}$, $R^{6b}$ and included in Chemical Formula 3.

The first polyorganosiloxane resin may include carbon-carbon double bonds at terminal ends thereof, the carbon-carbon double bonds being capable of undergoing a hydrosilation reaction.

The first polyorganosiloxane resin may have a number average molecular weight of about 900 to about 20,000.

The first polyorganosiloxane resin may be included in an amount of about 15 to about 45 parts by weight, based on the total amount of the polyorganosiloxane composition. Particularly, the amount ratio of the first polyorganosiloxane resin is based on 100 parts by weight of the polyorganosiloxane composition.

Including the first polyorganosiloxane resin within the range may help ensure hardness of the polyorganosiloxane is maintained after curing and a suitable modulus is achieved, thereby improving crack resistance.

The first polyorganosiloxane resin may be prepared, for example, according to the methods described below.

In an implementation, the first polyorganosiloxane resin may be prepared by hydrosilylating an alicyclic compound having two carbon-carbon double bonds with a compound having two silicon-hydrogen bonds.

For example, the compounds represented by the following Chemical Formula 1aa, 1ab, or 1ac (as the alicyclic compound having two carbon-carbon double bonds) may undergo a hydrosilation reaction with a compound including two hydrogen-silicon bonds.

[Chemical Formula 1aa]

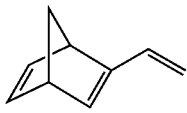

[Chemical Formula 1ab]

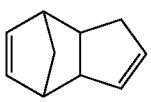

[Chemical Formula 1ac]

In another implementation, the first polyorganosiloxane resin may be prepared by first hydrosilylating an alicyclic compound having two carbon-carbon double bonds with a silane compound and then cohydrolyzing the resulting product with a dichloroalkylsilane or dichloroarylsilane compound.

For example, the compounds represented by Chemical Formula 1aa (as the alicyclic compound having two carbon-carbon double bonds) may undergo a hydrosilation reaction with dichlorodialkylsilane or dichlorodiarylsilane to provide a structure of the following Chemical Formula 1ad.

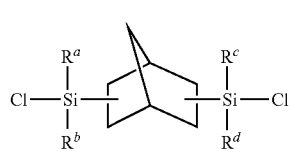

[Chemical Formula 1ad]

In Chemical Formula 1ad, $R^a$ and $R^b$ may each independently be a C1 to C10 alkyl group, $R^c$ and $R^d$ may each independently be a C6 to C20 aryl group.

Subsequently, the compound represented by Chemical Formula 1ad may be cohydrolyzed with dichloroalkylsilane or dichloroarylsilane to provide the first polyorganosiloxane resin.

In yet another implementation, the first polyorganosiloxane resin may be prepared by cohydrolyzing a compound including an aromatic group between two silicon atoms with a silane compound.

The second polyorganosiloxane resin may be a compound represented by the following Chemical Formula 3.

$[R^7SiO_{3/2}]_T[R^8R^9SiO]_D[R^{10}R^{11}R^{12}SiO_{1/2}]_M$ [Chemical Formula 3]

In Chemical Formula 3, $R^7$ to $R^{12}$ may each independently be a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof. In an implementation, at least one of $R^{10}$, $R^{11}$, and $R^{12}$ may be an alkenyl group. In addition, T, D, and M may satisfy the relations: T>0, D≥0, M>0 and T+D+M=1.

In the above Chemical Formula 3, at least about 10% of $R^7$ to $R^{12}$ may include an aryl group. The figure 10% indicates the ratio of the number of $R^7$ to $R^{12}$ being an aryl group to a total number of $R^7$ to $R^{12}$ included in Chemical Formula 3.

The second polyorganosiloxane resin may play a role in determining hardness when the polyorganosiloxane composition is cured.

The second polyorganosiloxane resin may be included in an amount of about 15 to 45 parts by weight, based on the total weight of the polyorganosiloxane composition. Particularly, the amount ratio of the second polyorganosiloxane resin is based on 100 parts by weight of the polyorganosiloxane composition.

Maintaining the amount of the second polyorganosiloxane resin within the range may help ensure that hardness of the polyorganosiloxane composition after curing is appropriately maintained.

The polyorganosiloxane composition may further include a curing agent. For example, the curing agent may include 3,3-diphenyl-1,1,5,5-tetramethyltrisiloxane, bis[(p-dimethylsilyl)phenyl]ether, 1,3-diphenyl-1,1,3,3-tetrakis(dimethylsiloxy)disiloxane, preferably, 3,3-diphenyl-1,1,5,5-tetramethyltrisiloxane. The curing agent may be a compound including two silicon-hydrogen bonds at terminal ends thereof.

In an implementation curing agent may include, e.g., a compound represented by the following Chemical Formula 4.

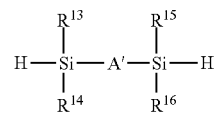

[Chemical Formula 4]

In Chemical Formula 4, A' may be an organic group including at least one aromatic ring, $R^{13}$ to $R^{16}$ may each independently be hydrogen, a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof.

The compound represented by Chemical Formula 4 may be at least one of, e.g., compounds represented by the following Chemical Formulae 4a, 4b, and 4c.

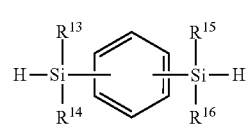

[Chemical Formula 4a]

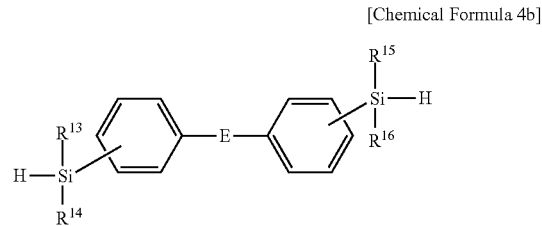

[Chemical Formula 4b]

-continued

[Chemical Formula 4c]

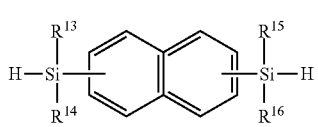

In Chemical Formulae 4a to 4c, $R^{13}$ to $R^{16}$ are the same as described above, E may be a single bond, oxygen, a sulfonyl group, a methylene group, an ethylene group, a propylene group, a hexafluoropropylene group, or a combination thereof.

The silicon-hydrogen bond of the curing agent may be included in a ratio of about 0.5 to 2.0 moles per 1 mol of a double bond included in the first polyorganosiloxane resin and the second polyorganosiloxane resin. When the silicon-hydrogen bond is included within the range, a sufficient curing degree of the polyorganosiloxane during the curing may be achieved and oxidation or discoloring of the cured product (due to non-reacted silicon-hydrogenbonds) may be simultaneously prevented.

The curing agent may be included in an amount of about 15 to 40 parts by weight, based on the total amount of the polyorganosiloxane composition. Particularly, the amount ratio of the curing agent is based on 100 parts by weight of the polyorganosiloxane composition.

When the curing agent is included within the range, hardness of the polyorganosiloxane composition after the curing may be maintained.

The polyorganosiloxane composition may further include a hydrosilation catalyst other than the aforementioned first and second polyorganosiloxane resins. The hydrosilation catalyst may be a catalyst including, e.g., platinum, rhodium, palladium, ruthenium, iridium, osmium, or a combination thereof, as a central metal. For example, the hydrosilation catalyst may a Karstedt catalyst prepared through reaction of chloroplatinic acid and 1,3-divinyl-1,1,3,3-tetramethoxysiloxane. The hydrosilation catalyst may be included in an amount of about 0.1 ppm to 1,000 ppm, based on the total amount of the polyorganosiloxane composition.

The polyorganosiloxane composition may be cured, and thus may be used as an encapsulation material for an electronic device. Herein, the electronic device may include, e.g., a light emitting diode, an organic light emitting device, a photoluminescent device, and/or a solar cell encapsulated by the encapsulation material, but is not limited thereto.

The encapsulation material prepared from the polyorganosiloxane composition may exhibit heat and light resistance. Thus, a coefficient of thermal expansion may be decreased and high transmittance and a high refractive index may be achieved, thereby improving crack resistance and adherence. In addition, generation of oligomers (having a low molecular weight) during the manufacturing process of polysiloxane may be reduced, thereby decreasing tackiness on the surface and improving workability.

The following Examples illustrate the embodiments in more detail. However, they are exemplary embodiments of the present invention and are not limiting. Moreover, the Comparative Example is set forth to highlight certain characteristics of certain embodiments and are not to be construed as either limiting the scope of the invention as exemplified in the Examples or as necessarily always being outside the scope of the invention in every respect.

Synthesis of First Polyorganosiloxane

Synthesis Example 1

158.65 g (1.2 mol) of dicyclopentadiene was added to 600 g of toluene in a five-necked flask with an agitator, a temperature controller, a nitrogen gas-injector, a cooler, and a Dean-Stark trap, while nitrogen was flowed therethrough and dissolved therein. Herein, PS-CS-1.8CS(Unicore) was added thereto, so that the reaction solution had a Pt concentration of 20 ppm. A solution prepared by dissolving 332 g (1 mol) of 3,3-diphenyl-1,1,5,5-tetramethyltrisiloxane in 600 g of toluene was slowly added dropwise into the above solution for about 30 minutes. Then, the reaction solution was heated for reflux for 24 hours. The resulting reaction solution was passed through a 5 cm-thick silica gel column to remove a platinum complex. Solvent was removed under reduced pressure distillation, preparing a linear polyorganosiloxane resin (A-1).

The polyorganosiloxane resin (A-1) had a number average molecular weight of 12,000. When the polyorganosiloxane resin (A-1) was analyzed using gel permeation chromatography (GPC), oligomers with a low molecular weight (less than 500) were not present.

Synthesis Example 2

A polyorganosiloxane resin (A-2) was prepared according to the same method as in Synthesis Example 1, except for using 185.09 g (1.4 mol) of dicyclopentadiene.

The polyorganosiloxane resin (A-2) had a number average molecular weight of 8,500. When the polyorganosiloxane resin (A-2) was analyzed using gel permeation chromatography (GPC), oligomers with a low molecular weight (less than 500) were not present.

Synthesis Example 3

A polyorganosiloxane resin (A-3) was prepared according to the same method as in Synthesis Example 1, except for using 211.54 g (1.6 mol) of dicyclopentadiene.

The polyorganosiloxane resin (A-3) had a number average molecular weight of 4,700. When the polyorganosiloxane resin (A-3) was analyzed using gel permeation chromatography (GPC), oligomers with a low molecular weight (less than 500) were not present.

Synthesis Example 4

129.6 g (1.2 mol) of 1,4-divinylbenzene was added to 600 g of toluene in a five-necked flask with an agitator, a temperature controller, a nitrogen gas-injector, a cooler, and a Dean-Stark trap, while nitrogen was flowed therethrough and dissolved therein. Herein, PS-CS-1.8CS(Unicore) was added thereto, so that the reaction solution had a Pt concentration of 20 ppm. A solution prepared by dissolving 332 g (1 mol) of 3,3-diphenyl-1,1,5,5-tetramethyltrisiloxane in 600 g of toluene was slowly added dropwise into the above solution for about 30 minutes. Then, the reaction solution was heated for reflux for 24 hours. The resulting reaction solution was passed through a 5 cm-thick silica gel column to remove a platinum complex. Solvent was removed under reduced pressure distillation, preparing a linear polyorganosiloxane resin (A-4).

The polyorganosiloxane resin (A-4) had a number average molecular weight of 11,600. When the polyorganosiloxane resin (A-4) was analyzed using gel permeation chromatography (GPC), oligomers with a low molecular weight (less than 500) were not present.

Synthesis Example 5

A polyorganosiloxane resin (A-5) was prepared according to the same method as in Synthesis Example 4, except for using 151.2 g (1.4 mol) of 1,4-divinylbenzene.

The polyorganosiloxane resin (A-5) had a number average molecular weight of 8,100. When the polyorganosiloxane resin (A-5) was analyzed using gel permeation chromatography (GPC), oligomers with a low molecular weight (less than 500) were not present.

Synthesis Example 6

A polyorganosiloxane resin (A-6) was prepared according to the same method as in Synthesis Example 4, except for using 172.8 g (1.6 mol) of 1,4-divinylbenzene.

The polyorganosiloxane resin (A-6) had a number average molecular weight of 4,300. When the polyorganosiloxane resin (A-2) was analyzed using gel permeation chromatography (GPC), oligomers with a low molecular weight (less than 500) were not present.

Synthesis of Second Polyorganosiloxane 1 kg of a mixed solvent prepared by mixing water and toluene in a weight ratio of 5:5 was put in a three-necked flask and maintained at 23° C., and 300 g of a mixture of phenyltrichlorosilane, bis(trichlorosilyl)methane, and vinyldimethylchlorosilane mixed in a mole ratio of 85:5:10 was added thereto in a dropwise for two hours. The resulting mixture was heated and refluxed for a condensation/polymerization reaction at 90° C. for 3 hours. Next, the reactant was cooled down to room temperature, and a water layer was removed therefrom, preparing a polymer solution dissolved in toluene. The polymer solution was washed with water to remove hydrochloric acid (HCl) produced therein as a byproduct. Then, the neutral polymer solution was distilled under reduced pressure to remove toluene, acquiring liquid polysiloxane. The polysiloxane was measured regarding molecular weight by performing gel permeation chromatography. As a result, it had a polystyrene-reduced molecular weight of 1900 g/mol. It was also identified to have a structure represented by Chemical Formula 8 by using H-NMR, Si-NMR, and an elemental analyzer. Herein, Me indicates a methyl group, Ph indicates a phenyl group, Vi indicates a vinyl group, and Si indicates silicon.

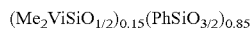

$$(Me_2ViSiO_{1/2})_{0.15}(PhSiO_{3/2})_{0.85} \quad \text{[Chemical Formula 3a]}$$

Preparation of Polyorganosiloxane Composition

Example 1

A polyorganosiloxane resin composition was prepared by mixing 3.83 g of the polyorganosiloxane resin (A-1) of Synthesis Example 1, 5 g of the polyorganosiloxane resin represented by the Chemical Formula 3a, 2.03 g of 3,3-diphenyl-1,1,5,5-tetramethyltrisiloxane, and PS-CS-1.8CS(Unicore) so that the reaction solution had a Pt concentration of 3 ppm.

Example 2

A polyorganosiloxane resin composition was prepared by mixing 1.65 g of the polyorganosiloxane resin (A-1) of Synthesis Example 1, 5.3 g of the polyorganosiloxane resin represented by the above Chemical Formula 3a, 2.07 g of 3,3-diphenyl-1,1,5,5-tetramethyltrisiloxane, and PS-CS-1.8CS (Unicore) so that the reaction solution had a Pt concentration of 3 ppm.

Example 3

A polyorganosiloxane resin composition was prepared by mixing 2.72 g of the polyorganosiloxane resin (A-2) of Synthesis Example 2, 5 g of the polyorganosiloxane resin represented by the above Chemical Formula 3a, 2.03 g of 3,3-diphenyl-1,1,5,5-tetramethyltrisiloxane, and PS-CS-1.8CS (Unicore) so that the reaction solution had a Pt concentration of 3 ppm.

Example 4

A polyorganosiloxane resin composition was prepared by mixing 1.18 g of the polyorganosiloxane resin (A-2) of Synthesis Example 2, 5.3 g of the polyorganosiloxane resin represented by the above Chemical Formula 3a, 2.07 g of 3,3-diphenyl-1,1,5,5-tetramethyltrisiloxane, and PS-CS-1.8CS (Unicore) so that the reaction solution had a Pt concentration of 3 ppm.

Example 5

A polyorganosiloxane resin composition was prepared by mixing 1.50 g of the polyorganosiloxane resin (A-3) of Synthesis Example 3, 5 g of the polyorganosiloxane resin represented by the above Chemical Formula 3a, 2.03 g of 3,3-diphenyl-1,1,5,5-tetramethyltrisiloxane, and PS-CS-1.8CS (Unicore) so that the reaction solution had a Pt concentration of 3 ppm.

Example 6

A polyorganosiloxane resin composition was prepared by mixing 0.65 g of the polyorganosiloxane resin (A-3) of Synthesis Example 3, 5.3 g of the polyorganosiloxane resin represented by the above Chemical Formula 3a, 2.07 g of 3,3-diphenyl-1,1,5,5-tetramethyltrisiloxane, and PS-CS-1.8CS (Unicore) so that the reaction solution had a Pt concentration of 3 ppm.

Example 7

A polyorganosiloxane resin composition was prepared by mixing 1.65 g of the polyorganosiloxane resin (A-4) of Synthesis Example 4, 5.3 g of the polyorganosiloxane resin represented by the above Chemical Formula 3a, 2.07 g of 3,3-diphenyl-1,1,5,5-tetramethyltrisiloxane, and PS-CS-1.8CS (Unicore) so that the reaction solution had a Pt concentration of 3 ppm.

Example 8

A polyorganosiloxane resin composition was prepared by mixing 1.65 g of the polyorganosiloxane resin (A-5) of Synthesis Example 5, 5.3 g of the polyorganosiloxane resin represented by the above Chemical Formula 3a, 2.09 g of 3,3-diphenyl-1,1,5,5-tetramethyltrisiloxane, and PS-CS-1.8CS (Unicore) so that the reaction solution had a Pt concentration of 3 ppm.

Example 9

A polyorganosiloxane resin composition was prepared by mixing 1.65 g of the polyorganosiloxane resin (A-6) of Synthesis Example 6, 5.3 g of the polyorganosiloxane resin represented by the above Chemical Formula 3a, 2.16 g of 3,3-diphenyl-1,1,5,5-tetramethyltrisiloxane, and PS-CS-1.8CS (Unicore) so that the reaction solution had a Pt concentration of 3 ppm.

Example 10

A polyorganosiloxane resin composition was prepared by mixing 1.65 g of the polyorganosiloxane resin (A-1) of Synthesis Example 1, 5.3 g of the polyorganosiloxane resin represented by the above Chemical Formula 3a, 2.07 g of bis(p-dimethylsilyl)phenyl)ether and PS-CS-1.8CS(Unicore) so that the reaction solution had a Pt concentration of 3 ppm.

Example 11

A polyorganosiloxane resin composition was prepared by mixing 1.65 g of the polyorganosiloxane resin (A-1) of Synthesis Example 1, 5.3 g of the polyorganosiloxane resin represented by the above Chemical Formula 3a, 2.07 g of bis(p-dimethylsilyl)benzene, and PS-CS-1.8CS(Unicore) so that the reaction solution had a Pt concentration of 3 ppm.

Comparative Example

A polyorganosiloxane resin composition was prepared by mixing 1.60 g of the polyorganosiloxane represented by the following Chemical Formula 5, 5 g of the polyorganosiloxane resin represented by the above Chemical Formula 3a, 1.97 g of 3,3-diphenyl-1,1,5,5-tetramethyltrisiloxane, and PS-CS-1.8CS(Unicore) so that the reaction solution had a Pt concentration of 3 ppm. [Chemical Formula 5]

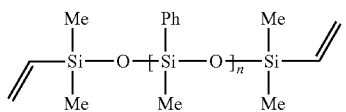

Evaluation—1

The polyorganosiloxane resin compositions according to Examples 1 to 11 and the Comparative Example were heated and cured in a 150° C. oven for one hour and measured regarding initial transmittance at 450 nm. The cured resin was allowed to stand in a 150° C. oven for 1,000 hours and measured regarding initial transmittance at 450 nm. A smaller initial transmittance and transmittance difference after the heat treatment was indicative of excellent heat and light resistance.

The results are shown in Table 1.

In Table 1, the coefficient of thermal expansion (CTE) was measured with a thermomechanical analysis (TMA) method. The tackiness was measured using TopTac 2000A by measuring a peeling force after applying a predetermined load to cured products.

TABLE 1

| | Tackiness (gf) | CTE (ppm) | Transmittance (%) | | |
|---|---|---|---|---|---|
| | | | 0 hour | 1,000 hour | $\Delta_{trans}$ |
| Example 1 | 15 | 169 | 99.3 | 96.5 | 2.8 |
| Example 2 | 15 | 198 | 99.7 | 96.0 | 3.7 |
| Example 3 | 15 | 232 | 99.9 | 96.9 | 3.0 |
| Example 4 | 12 | 298 | 99.5 | 95.7 | 3.8 |
| Example 5 | 6 | 323 | 99.6 | 95.9 | 3.7 |
| Example 6 | 9 | 268 | 99.4 | 95.8 | 3.6 |
| Example 7 | 11 | 212 | 99.6 | 95.9 | 3.7 |
| Example 8 | 15 | 298 | 99.3 | 96.2 | 3.1 |
| Example 9 | 10 | 309 | 99.7 | 96.1 | 3.6 |
| Example 10 | 11 | 239 | 99.5 | 95.7 | 3.8 |
| Example 11 | 13 | 321 | 99.6 | 95.8 | 3.8 |
| Comparative Example | 26 | 512 | 99.5 | 88.7 | 10.8 |

As shown in Table 1, the polyorganosiloxane compositions according to Examples 1 to 11 exhibited a low coefficient of thermal expansion (CTE), low tackiness, small $\Delta_{trans}$ after heat treatment, when compared with the polyorganosiloxane composition according to the Comparative Example. From these results, it may be seen that the polyorganosiloxane compositions according to Examples 1 to 11 exhibited excellent heat resistance and light resistance as well as a low coefficient of thermal expansion and tackiness.

Evaluation—2

Each polyorganosiloxane resin composition according to Examples 1 to 11 and the Comparative Example was injected into a cup having a 1 cm diameter and a 1 cm height, and curing in a 150° C. oven for 1 hour. The cured resins were allowed to stand in a −40° C. cooling bath and then a 120° C. oven for 30 minutes, respectively, to give rapid temperature change. The processes were repeated five times; and cracks in surfaces of the resins were examined.

The results are shown in Table 2, in which X represents no cracks being observed and O represents that cracks were observed.

TABLE 2

| | Crack |
|---|---|
| Example 1 | X |
| Example 2 | X |
| Example 3 | X |
| Example 4 | X |
| Example 5 | X |
| Example 6 | X |
| Example 7 | X |
| Example 8 | X |
| Example 9 | X |
| Example 10 | X |
| Example 11 | X |
| Comparative Example | O (multiple) |

As may be seen in Table 2, the polyorganosiloxane compositions according to Examples 1 to 11 did not show cracks on surfaces thereof, whereas the polyorganosiloxane composition according to the Comparative Example showed a plurality of cracks on surfaces thereof. From these results, it may be seen that the polyorganosiloxane compositions according to Examples 1 to 11 exhibited improved crack resistance.

By way of summation and review, polyorganosiloxanes may be superior to epoxy-based encapsulation material, which have relatively weak heat and light resistance. For example, in an encapsulation material including a polyorganosiloxane, breakage may be reduced or prevented and/or interface adherence may be improved due to a sufficiently low coefficient of thermal expansion after curing. In addition, a composition including a polyorganosiloxane may exhibit improved workability due to low surface tackiness.

The embodiments provide a polyorganosiloxane composition that increases crack resistance (in an encapsulation material) to thereby secure stability of a light emitting element and decrease tackiness to improve its workability as well as maintaining high heat resistance and light resistance.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A polyorganosiloxane composition for encapsulating an electronic device including one of a light emitting diode, an organic light emitting diode, a photoluminescent device, or a solar cell, the composition comprising:
a linear first polyorganosiloxane resin including a moiety represented by the following Chemical Formula 1 and a moiety represented by the following Chemical Formula 2, the first polyorganosiloxane resin including carbon-carbon double bonds at both terminal ends thereof,
a second polyorganosiloxane resin represented by the following Chemical Formula 3, the second polyorganosiloxane resin having a three dimensional network structure, and
a curing agent represented by the following Chemical Formula 4, the curing agent including at least two silicon-hydrogen bonds,
wherein:
the first polyorganosiloxane resin is included in an amount of about 10 to about 25 parts by weight, based on the total amount of the polyorganosiloxane composition, and
the second polyorganosiloxane resin is included in an amount of about 40 to about 75 parts by weight, based on the total amount of the polyorganosiloxane composition,

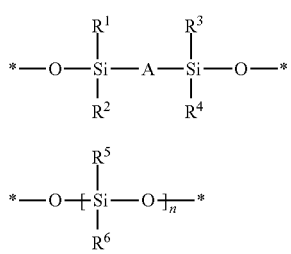

[Chemical Formula 1]

[Chemical Formula 2]

wherein, in Chemical Formulae 1 and 2, A is an organic group including at least two alicyclic rings, an organic group including at least one aromatic ring, or a combination thereof, $R^1$ to $R^6$ are each independently a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, n is 1 to about 50, * represents a bond to O, Si, and/or C, and an O in Chemical Formula 1 is the same as an O in Chemical Formula 2 such that Chemical Formulae 1 and 2 are connected by an O—Si—O linkage;

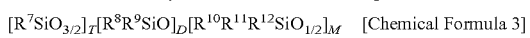 [Chemical Formula 3]

wherein, in Chemical Formula 3, $R^7$ to $R^{12}$ are each independently a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, provided that at least one of $R^{10}$, $R^{11}$ and $R^{12}$ is the C2 to C20 alkenyl group, T>0, D≥0, M>0, and T+D+M=1;

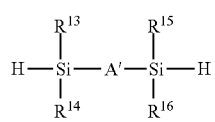

[Chemical Formula 4]

wherein, in Chemical Formula 4, A' is an organic group including at least one aromatic ring, and
$R^{13}$ to $R^{16}$ are each independently a hydrogen, a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof.

2. The polyorganosiloxane composition as claimed in claim 1, wherein about 10% or more of $R^7$ to $R^{12}$ in Chemical Formula 3 include an aryl group.

3. The polyorganosiloxane composition as claimed in claim 1, wherein the moiety represented by A in Chemical Formula 1 includes a moiety represented by at least one of the following Chemical Formulae 1a to 1e:

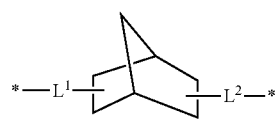

[Chemical Formula 1a]

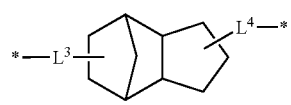

[Chemical Formula 1b]

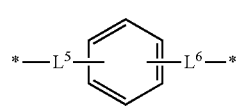

[Chemical Formula 1c]

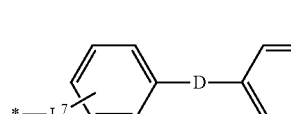

[Chemical Formula 1d]

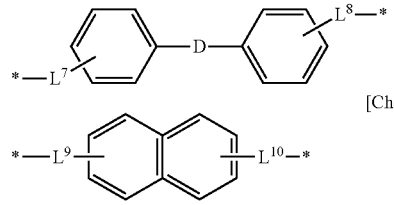

[Chemical Formula 1e]

wherein, in Chemical Formulae 1a to 1e, $L^1$ to $L^{10}$ are each independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C7 to C30 arylalkylene group, a substituted or unsubstituted C1 to C30 heteroalkylene group, a substituted or unsubstituted C2 to C30 heterocycloalkylene group, a substituted or unsubstituted C2 to C30 alkenylene group, or a combination thereof, D is a single bond, oxygen, a sulfonyl group, a methylene group, an ethylene group, a propylene group, a hexafluoropropylene group, or a combination thereof, and * represents a bond to O, Si, and/or C.

4. The polyorganosiloxane composition as claimed in claim 1, wherein about 30% or more of $R^5$ and $R^6$ in Chemical Formula 2 include an aryl group.

5. The polyorganosiloxane composition as claimed in claim 1, wherein the first polyorganosiloxane resin has a number average molecular weight of about 900 to about 20,000.

6. The polyorganosiloxane composition as claimed in claim 1, wherein the silicon-hydrogen bonds are included in an amount of about 0.5 to 2.0 moles per 1 mole of a double bond of the first polyorganosiloxane resin and the second polyorganosiloxane resin.

7. The polyorganosiloxane composition as claimed in claim 1, further comprising a hydrosilation catalyst.

8. An encapsulation material prepared by curing the polyorganosiloxane composition as claimed in claim 1.

9. An electronic device comprising the encapsulation material as claimed in claim 8.

10. The electronic device as claimed in claim 9, wherein the electronic device includes a light emitting diode, an organic light emitting diode, a photoluminescent device, or a solar cell encapsulated by the encapsulation material.

11. The polyorganosiloxane composition as claimed in claim 1, wherein the curing agent represented by Chemical Formula 4 is at least one of compounds represented by the following Chemical Formulae 4a, 4b, and 4c,

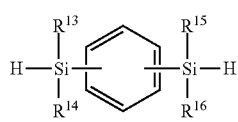

[Chemical Formula 4a]

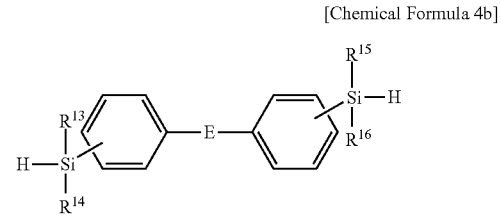

[Chemical Formula 4b]

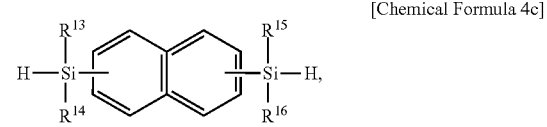

[Chemical Formula 4c]

wherein, in Chemical Formulae 4a to 4c, $R^{13}$ to $R^{16}$ are each independently a hydrogen, a substituted or unsubstituted C1 to C10 alkyl group, a substituted or unsubstituted C3 to C20 cycloalkyl group, a substituted or unsubstituted C6 to C20 aryl group, a substituted or unsubstituted C7 to C20 arylalkyl group, a substituted or unsubstituted C1 to C20 heteroalkyl group, a substituted or unsubstituted C2 to C20 heterocycloalkyl group, a substituted or unsubstituted C2 to C20 alkenyl group, a substituted or unsubstituted C2 to C20 alkynyl group, a substituted or unsubstituted C1 to C10 alkoxy group, a halogen, or a combination thereof, and E is a single bond, oxygen, a sulfonyl group, a methylene group, an ethylene group, a propylene group, a hexafluoropropylene group, or a combination thereof.

* * * * *